(12) United States Patent
Hori (10) Patent No.: US 8,175,198 B2
(45) Date of Patent: May 8, 2012

(54) MATCHED FILTER AND RECEIVER

(75) Inventor: Kazuyuki Hori, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 598 days.

(21) Appl. No.: 12/338,391

(22) Filed: Dec. 18, 2008

(65) Prior Publication Data

US 2009/0175391 A1  Jul. 9, 2009

(30) Foreign Application Priority Data

Jan. 7, 2008  (JP) .................. 2008-000515

(51) Int. Cl.
*H03D 1/00* (2006.01)
(52) U.S. Cl. ........................ 375/343; 375/152
(58) Field of Classification Search .................. 375/343, 375/152, 143
See application file for complete search history.

(56) References Cited

U.S. PATENT DOCUMENTS 7,876,811 B2 * 1/2011 Tanaka .................. 375/150

FOREIGN PATENT DOCUMENTS

WO    WO 00/31659 A   6/2000

OTHER PUBLICATIONS

European Search Report issued in European Patent Application No. EP 08021949 dated May 28, 2009.
Kitamura et al., "Low Power Consumption CMOS Digital Matched Filter—An Application Example of the Plastic Hard Macro™ Technology," Johoshorigakkaironbun-shi vol. 42, No. 4, (Apr. 2001), pp. 1016-1022, w/ English translation thereof.
Chu, David C., "Polyphase Codes with Good Periodic Correlation Properties," pp. 531-532, IEEE Transactions on Information Theory (Jul. 1972).

* cited by examiner

*Primary Examiner* — Kevin Kim
(74) *Attorney, Agent, or Firm* — McDermott Will & Emery LLP (57) ABSTRACT

A matched filter and receiver is provided to delete the tap coefficients of a matched filter used in an OFDM receiver. In the matched filter and receiver, a transmitting signal is generated by using a symmetric series (Y) obtained from $C[k]= \exp[j*\pi*M/N*(k+0.5)^2]$, where $X=[0, C[N/2], C[N/2+1], \ldots, C[N-1], 0, 0, \ldots, 0, C[0], C[1], \ldots, C[N/2-1]]$, and Y=inverse FFT (X) as a base symbol. The matched filter, which detects the signal, reduces the number of multipliers by using the coefficient symmetric property.

3 Claims, 9 Drawing Sheets

MATCHED FILTER AND RECEIVER

CLAIM OF PRIORITY

The present application claims priority from Japanese patent application serial no. 2008-000515, filed on Jan. 7, 2008, the content of which is hereby incorporated by reference into this application.

BACKGROUND OF THE INVENTION

The present invention relates to a matched filter and a receiver, more specifically, to a matched filter having a reduced number of complex multipliers and a receiver using the matched filter.

In the field of radio communication, various systems have been studied and put into practice, targeting for improvement of frequency use efficiency. One of them is orthogonal frequency division multiplexing (OFDM), which now is a leading mobile communications system for the fourth generation because of its effectiveness against the delay of multipath radio waves.

Figure 1:
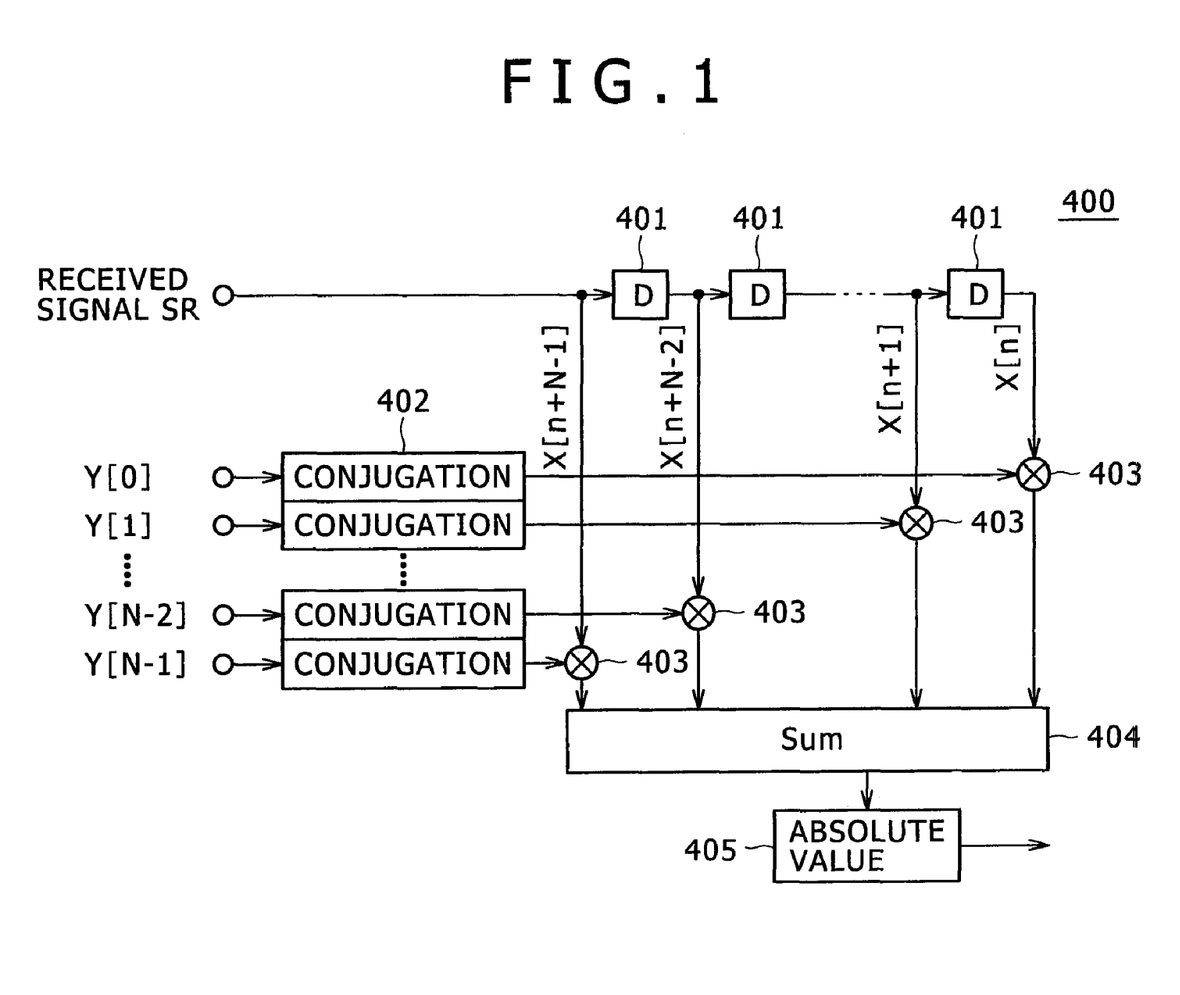
FIG. 1 is a block diagram of a data circulation type matched filter.

Kitamura et al., in "Low Power Consumption CMOS Digital Matched Filter: An application Example of the Plastic Hard Macro Technology" (Technical Report of Institute of Electronics, Information and Communication Engineers, Vo. 42, No. 4, 2001), discloses a matched filter. In particular, the report illustrates two types of code division multiple accesses (CDMAs), that is, data circulation type and code circulation type. The configuration of a data circulation type matched filter which adopts OFDM-based technologies is first explained with reference to FIG. 1. FIG. 1 is a block diagram of a data circulation type matched filter. In FIG. 1, a matched filter 400 is constituted of (N−1) stage serial delay circuits 401, N multiplication circuits 403, each receiving a symbol Y[k] (k=0, . . . , N−1) through a conjugation circuit 402, a summing circuit 404 for summing outputs of the multiplication circuits, and an absolute value circuit 405 for calculating an absolute value of the output from the summing circuit 404. A received signal SR is output, per clock, to each of the multiplication circuits 403 and multiplied by the symbol Y[k]. The operating principle of the matched filter is basically similar to that of a finite impulse response (FIR) digital filter, repeatedly calculating a correlation between input signal and filter coefficient.

Factor for the matched filter can be written as follows. Let L be an even number, and let C be the known data. Dividing the known data C by first half L/2 points and second half L/2 points to obtain, $$X=[0,C[L/2],C[L/2+1],\ldots,C[L-1],0,0,\ldots,0,C[0],\\C[1],\ldots,C[L/2-1]]$$ (Formula 1).

To make the number of N be a power of 2, zeros are inserted into the head and in front of the first half L/2, as behind the second half L/2, to make an array X. Next, by using a series Y obtained by applying an inverse FFT to the array X, a correlation between the series Y and the received signal SR is calculated.

By nature of a correlation function, an output absolute value becomes the maximum when timing of the matched filter coefficient Y and timing of the received signal SR coincide with each other. At this time, the signal is cut out with a serial-parallel converter (SP converter) connected to the absolute value circuit 405. In this way, symbol timing can be detected. "0" at the head of the array X corresponds to direct current, and "0" in the middle corresponds to out-of-band frequency, each being excluded from the inverse FFT calculation. The direct current is excluded because a direct current portion changes by the circuit offset.

As for the matched filter coefficient Y, a signal whose autocorrelation sequence is close to impulse, subcarrier power of which is distributed roughly uniformly, and which has a low PAPR (Peak to Average Power Ratio), is suitable. As for a series with the above nature, there is the Chu series of the formula 2, which is a signal used for known data C. Let L be the length of a series (which is an arbitrary even number), and let M be an arbitrary integer. The CHU series is described in "Polyphase Codes with Good Periodic Correlation Properties", by David C. Chu, IEEE Transactions on Information Theory, July 1972.

$$C[k]=\exp[j*\pi*M/N*k^2](k=0,1,\ldots,L-1)$$ (Formula 2)

In the CHU series, the constant M and the series length L are relatively prime so as to increase the autocorrelation and decrease PAPR.

Figure 2:
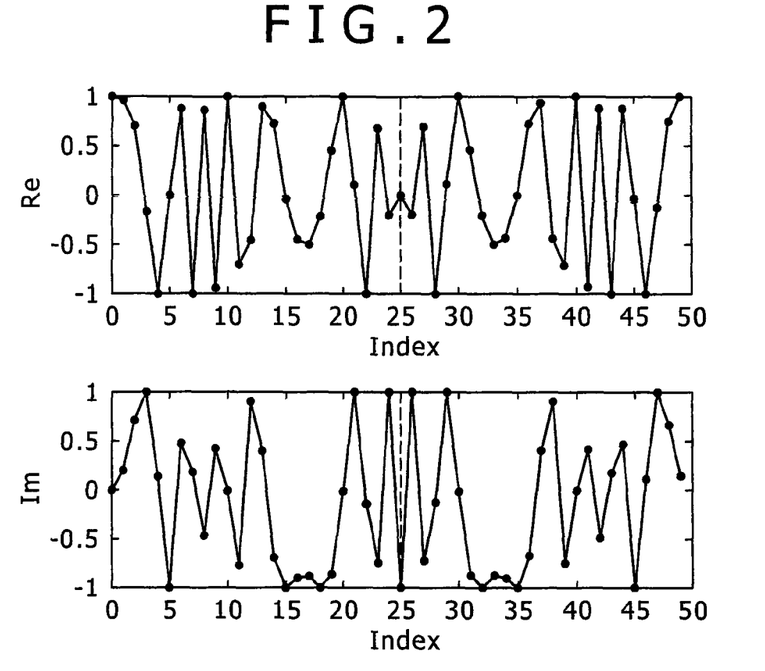
FIG. 2 is a graph plotting C[k], when L=50, M=3, and N=64.

C[k] is plotted on graphs as shown in FIG. 2, when L=50, M=3, and N=64. In FIG. 2, the upper stage is a real part, and the lower stage is an imaginary part. To obtain an array X, C[k] is divided into the first half L/2 points and the second half L/2 points, and zeros are inserted, according to the formula 1, to make the size be N. The resulting array X is one "0" at the head, twenty-five of the second half L/2 points "C[L/2], C[L/2+1], . . . , C[L−1]", and thirteen "0"s, and twenty-five of the first half L/2 points "C[1], . . . , C[L/2−1]".

Figure 3:
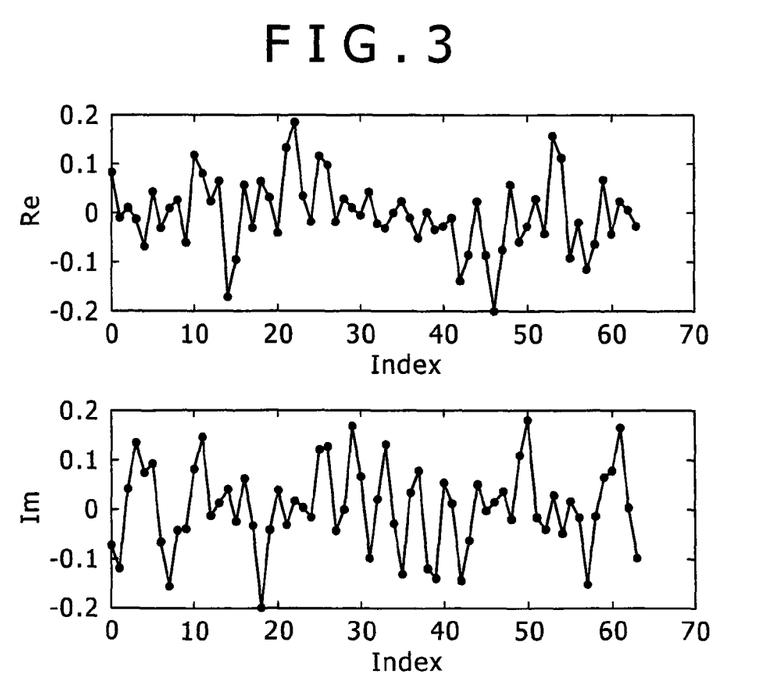
FIG. 3 shows a series Y that is obtained by applying an inverse FFT to an array X.
Figure 4:
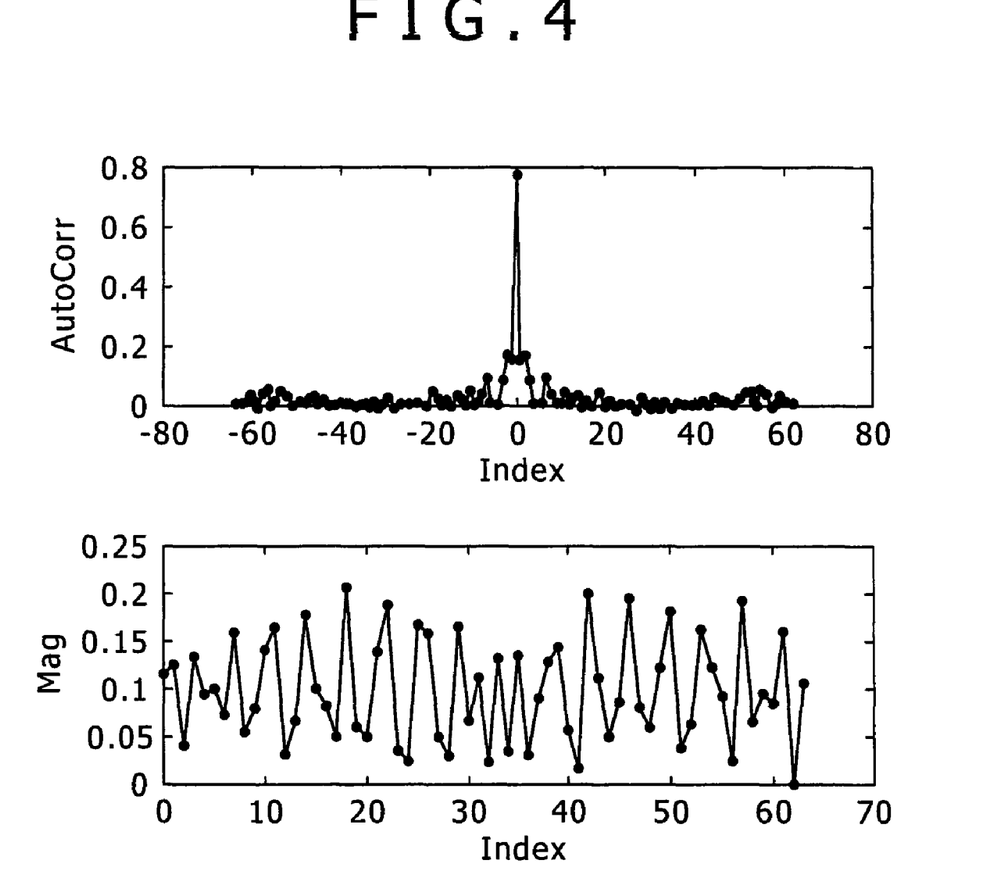
FIG. 4 shows an autocorrelation function and magnitude of the series Y.

By applying an inverse FFT to the resulting array X, a series Y is plotted on graphs as shown in FIG. 3. In FIG. 3, the upper stage is a real part, and the lower stage is an imaginary part. An autocorrelation function and absolute value of the series Y are also plotted on graphs as shown in FIG. 4. In FIG. 4, the upper stage is autocorrelation, and the lower stage is magnitude. As one can see from FIG. 4, the series Y has a low PAPR and its autocorrelation has an impulse pattern. Here, the effective value of a known symbol Y is 0.1105, and the maximum magnitude is 0.2017. PAPR of the series Y is then found as:

20 log 10(0.2017/0.1105)=5.228[dB].

SUMMARY OF THE INVENTION

The known data C as the base of the known symbol Y that is obtained in the sequence described above is symmetric with respect to an index 25 (broken lines on the drawing), according to FIG. 2. If an array X is made by dividing it into the first half and the second half, X becomes asymmetric. Accordingly, the series Y shown in FIG. 3 also becomes asymmetric. Therefore, complex multipliers as many as N are required to constitute a matched filter. If N has a large value, the number of complex multipliers that are required also increases, making it difficult to realize a matched filter. Thus, it is necessary to cut down the number of filter taps by sacrificing the timing detection performance. It is, therefore, a problem of the present invention to reduce the number of complex multipliers needed, without sacrificing the matched filter performance.

To solve the foregoing problem of the matched filter, known data C is generated from the formula 3 below:

$$C[k]=\exp[j*\pi*M/L*(k+0.5)^2](k=0,1,\ldots,L-1)$$ (Formula 3)

The formula 3 differs from the formula 2 in that 0.5 as an offset is added to the index k.

To obtain an array X, C[k] is divided into the first half L/2 points and the second half L/2 points, and zeros (1+13) are inserted, according to the formula 1, to make the size be be a power of 2, N. An inverse FET is then applied to the array X to obtain a series Y which is used as a known symbol. At this time, the series Y becomes symmetric, being excluded from the influence of "0" at the head in the formula 1 because of bias 0.5 added to the index k.

Since the series Y is symmetric, it is possible to integrate complex multipliers having the same absolute value of the matched filter coefficient and thus to realize the matched filter by one multiplier. In this way, the number of complex multipliers can be reduced by half.

BRIEF DESCRIPTION OF THE DRAWINGS

Preferred embodiments of the present invention will now be described in conjunction with the accompanying drawings, in which.

DETAILED DESCRIPTION OF THE PREFERRED EMBODIMENTS

Reference will now be made in detail to the modes of the present invention, embodiments of which are illustrated in the accompanying drawings. In the following description, the same drawing reference numerals are used for the same elements even in different drawings, and they will not be described repeatedly.

Figure 5:
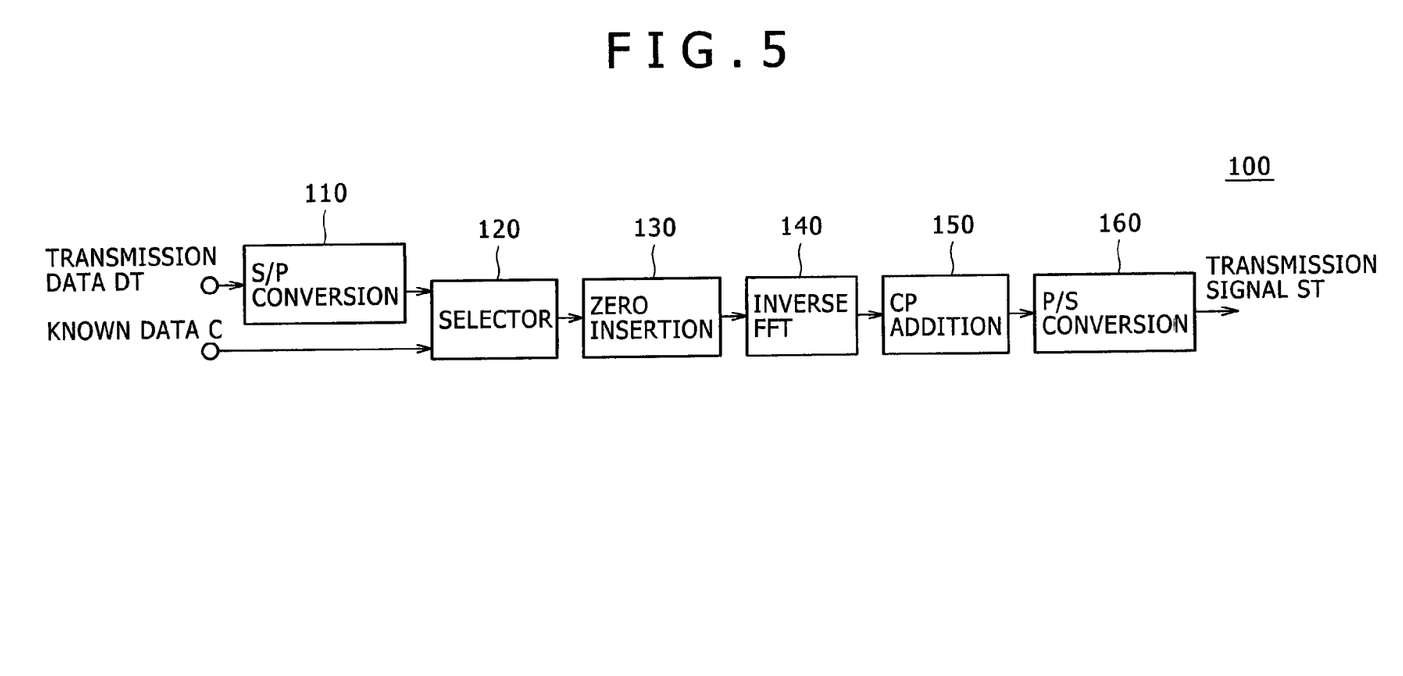
FIG. 5 is a functional block diagram of an OFDM transmitter.

First, an OFDM transmitter is explained with reference to FIG. 5. FIG. 5 is a functional block diagram of an OFDM transmitter. An OFDM transmitter 100 includes a serial parallel (S/P) converter 110, a selector 120, a zero insertion unit 130, an inverse FFT unit 140, a CP addition unit 150, a parallel serial (P/S) converter 160.

The S/P converter 110 performs S/P conversion on transmission data DT that is primarily modulated by quadrature amplitude modulation (QAM), etc., per L points. The selector 120 selects the converted parallel transmission data DT or the known data C. The zero insertion unit 130 inserts zero into data positions corresponding to the direct current (the head) and out-of-band frequency (the middle part) to make the number of data that the selector 120 has selected be a power of 2, N. The inverse FFT unit 140 applies an inverse FFT to the zero inserted parallel data to obtain a transmission symbol.

The CP addition unit 150 adds, to the front of the transmission symbol, a redundancy portion (a copied portion of the second half of the symbol) called CP (Cyclic Prefix). The P/S converter 160 performs P/S conversion again to obtain a transmission signal ST.

The selector 120 is also prepared to insert a symbol Y that is generated from the known data C into a specific symbol position. Suppose a frame format is composed of six symbols. Then, a frame format having allocated the first symbol to the known symbol Y and the second through sixth symbols to the subsequent transmission data DT is shown in FIG. 6.

Figure 6:
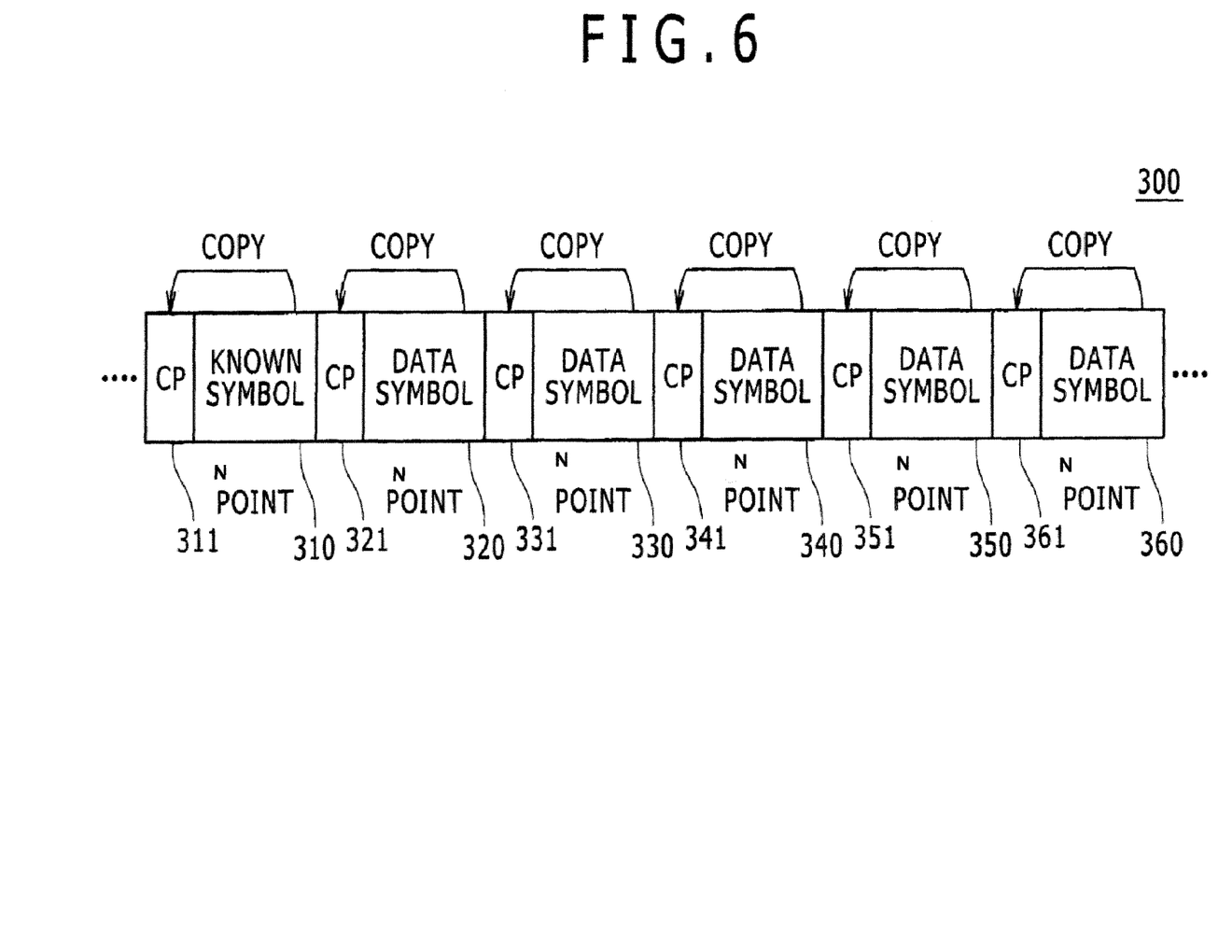
FIG. 6 is an explanatory view of a frame format.

In FIG. 6, the left end is the head of the transmission frame format 300. In front of a known symbol 310 is a CP 311, which is a copied portion of the second half of the known symbol 310. Similarly, in front of symbols 320 to 360 are CPs 321 to 361, which are copied portions of the second half of the symbols 320 to 360. The CPs 311 to 361 are prepared to lessen interference caused by delay waves in a radio path.

Figure 7:
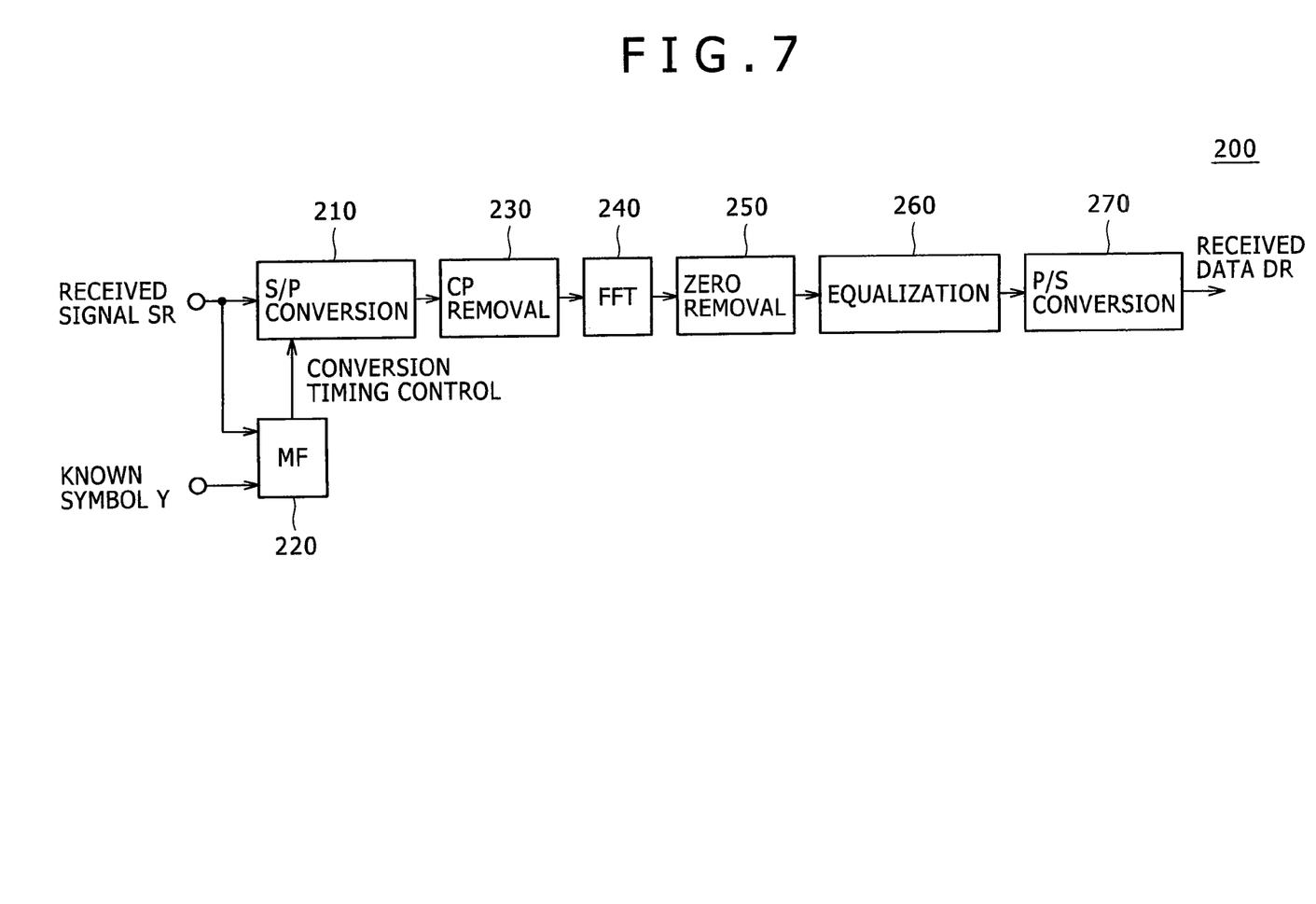
FIG. 7 is a functional block diagram of an OFDM receiver.

An OFDM receiver is now explained with reference to FIG. 7. FIG. 7 is a functional block diagram of an OFDM receiver. An OFDM receiver 200 receives a received signal SR and the known symbol Y. To this end, it includes a matched filter 220 for extracting timing, an S/P converter 210 for performing S/P conversion on a received signal SR at the conversion timing that is obtained from an output of the matched filter 220, a CP removal unit 230 for removing a CP from a parallel signal, an FFT unit 240 for performing Fourier transformation on an output of the CP removal unit 230, a zero removal unit 250 for removing zeros inserted, an equalization unit 260, and a P/S converter 270.

The matched filter 220 extracts timing and controls, by the matched filter output, the S/P conversion timing of a received signal SR. If a signal is not cut out synchronously with the inverse FFT timing, inter symbol interference occurs. However, since the transmission side has inserted CP, a slight timing jitter is allowed as long as the length of the CP is not affected thereby. The CP removal unit 230 removes CP. The FFT 240 performing an FFT process. The zero removal unit 260 removes zeros inserted. The resulting demodulated data has distorted amplitude and distorted phase, under the influence of frequency characteristics of the radio propagation path or under the influence of multipath reception. The equalization unit 260 computes a correction value of the radio propagation path, based on a comparison between the known data C and its demodulation result. By applying the resulting correction value to a subsequent data symbol, the equalization unit 260 equalizes influences of the radio propagation path. The P/S converter 270 performs P/S conversion on an output of the equalization unit 260 to obtain received data DR.

Figure 8:
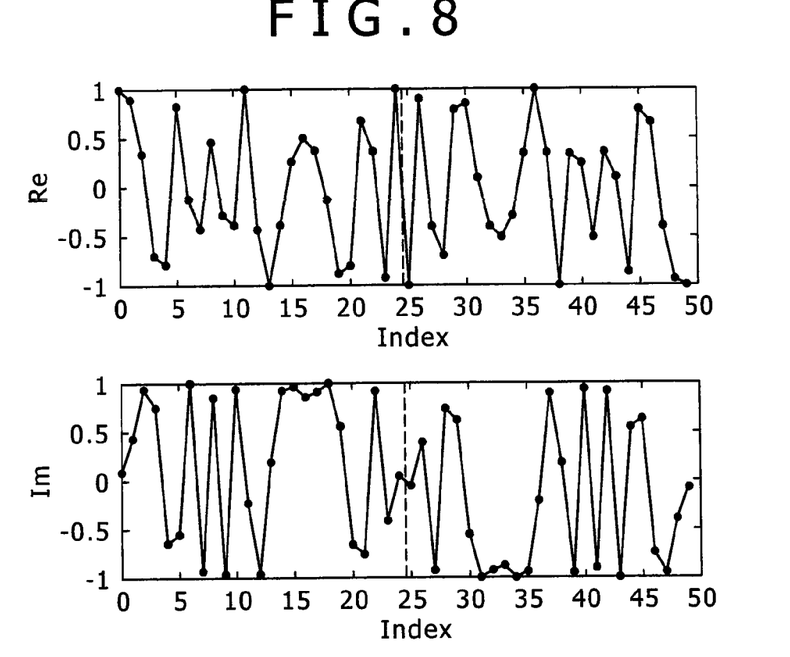
FIG. 8 is a graph plotting C[k], when L=50, M=3, and N=64.

C[k] is plotted on graphs as shown in FIG. 8, when L=50, M=3, and N=64. In FIG. 8, the upper stage is a real part, and the lower stage is an imaginary part. Known data C of FIG. 8 is symmetric with respect to an intersecting point with the index 24.5 (broken lines on the drawing). To obtain an array X, C[k] is divided into the first half L/2 points and the second half L/2 points, and zeros are inserted to the head and the middle portion, according to the formula 1, to make the size be a power of 2, N.

The array X remains symmetric even if it is divided, being excluded from the influence of "0" at the head because of bias 0.5 added to the index k. That is, X becomes symmetric. Moreover, by natures of the FFT and inverse FFT, if inputs are symmetric, outputs thereof are also symmetric.

Figure 9:
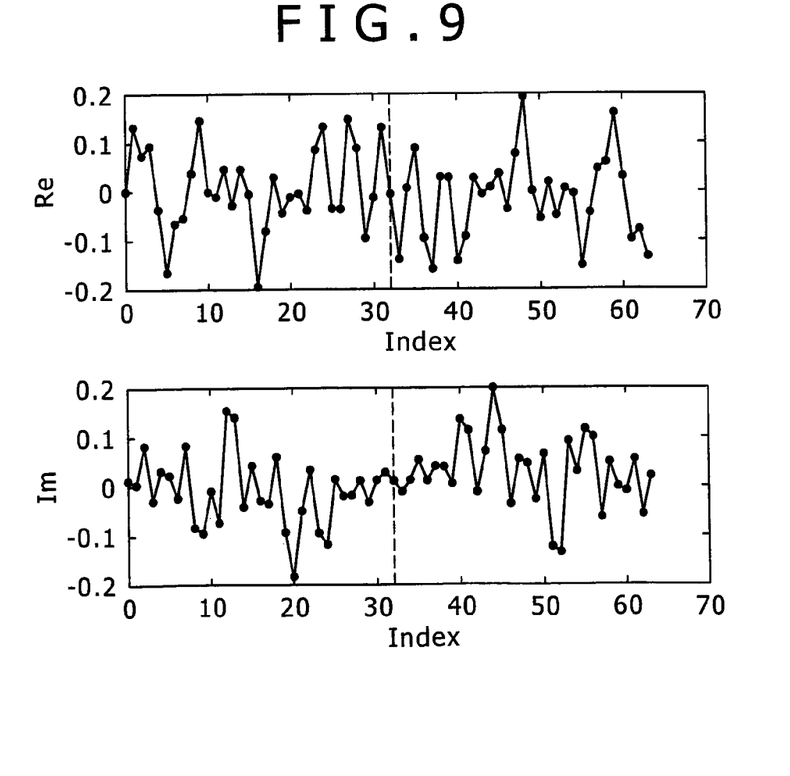
FIG. 9 shows a series Y that is obtained by applying an inverse FFT to an array X.
Figure 10:
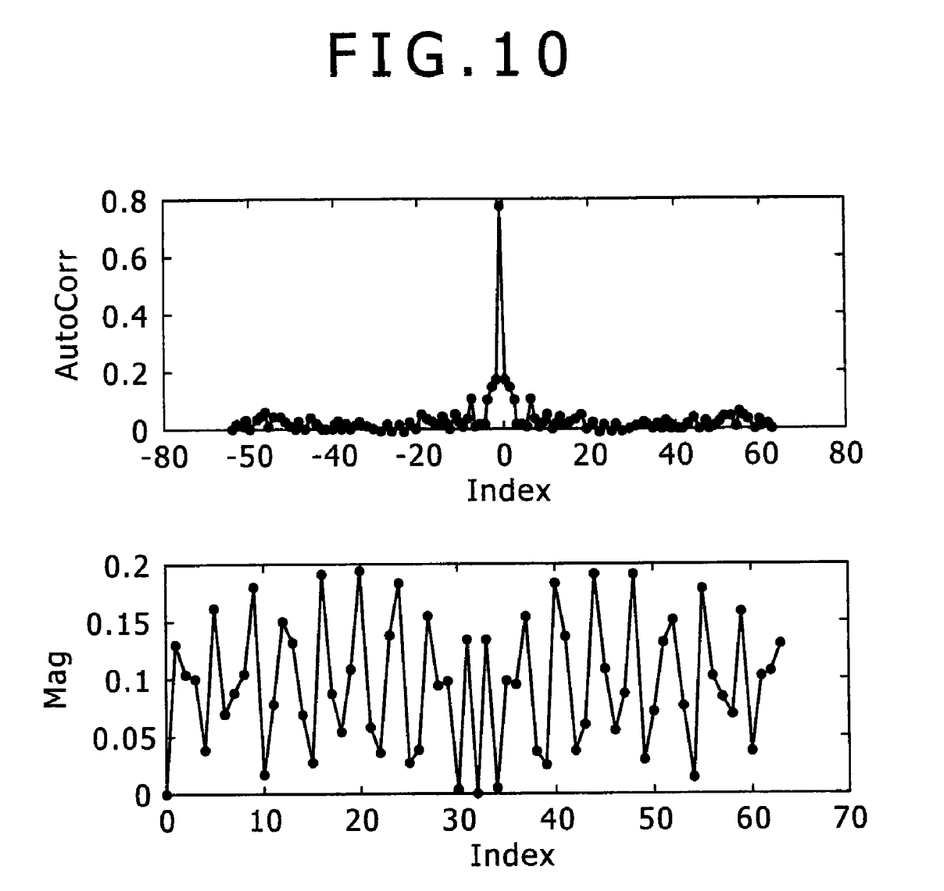
FIG. 10 shows an autocorrelation function and magnitude of the series Y.

Therefore, as shown in FIG. 9, a series Y, which is obtained by applying an inverse FFT to the array X, has zero for the value of the index 0 and is symmetric with respect to an intersecting point with the index 32 (broken lines on the drawing). An autocorrelation function and an absolute value of the series Y are plotted on graphs as shown in FIG. 10. In FIG. 9, the upper stage is a real part, and the lower stage is an imaginary part. In FIG. 10, the upper stage is autocorrelation, and the lower stage is magnitude. As one can see from FIG.

10, the series Y has a low PAPR and its autocorrelation has an impulse pattern. This provides results equivalent to those of FIG. 4. In FIG. 10, the effective value of a known symbol Y is 0.1105, and the maximum magnitude is 0.1928. PAPR of the series Y is then found as:

20 log 10(0.1928/0.1105)=4.835[dB].

Figure 11:
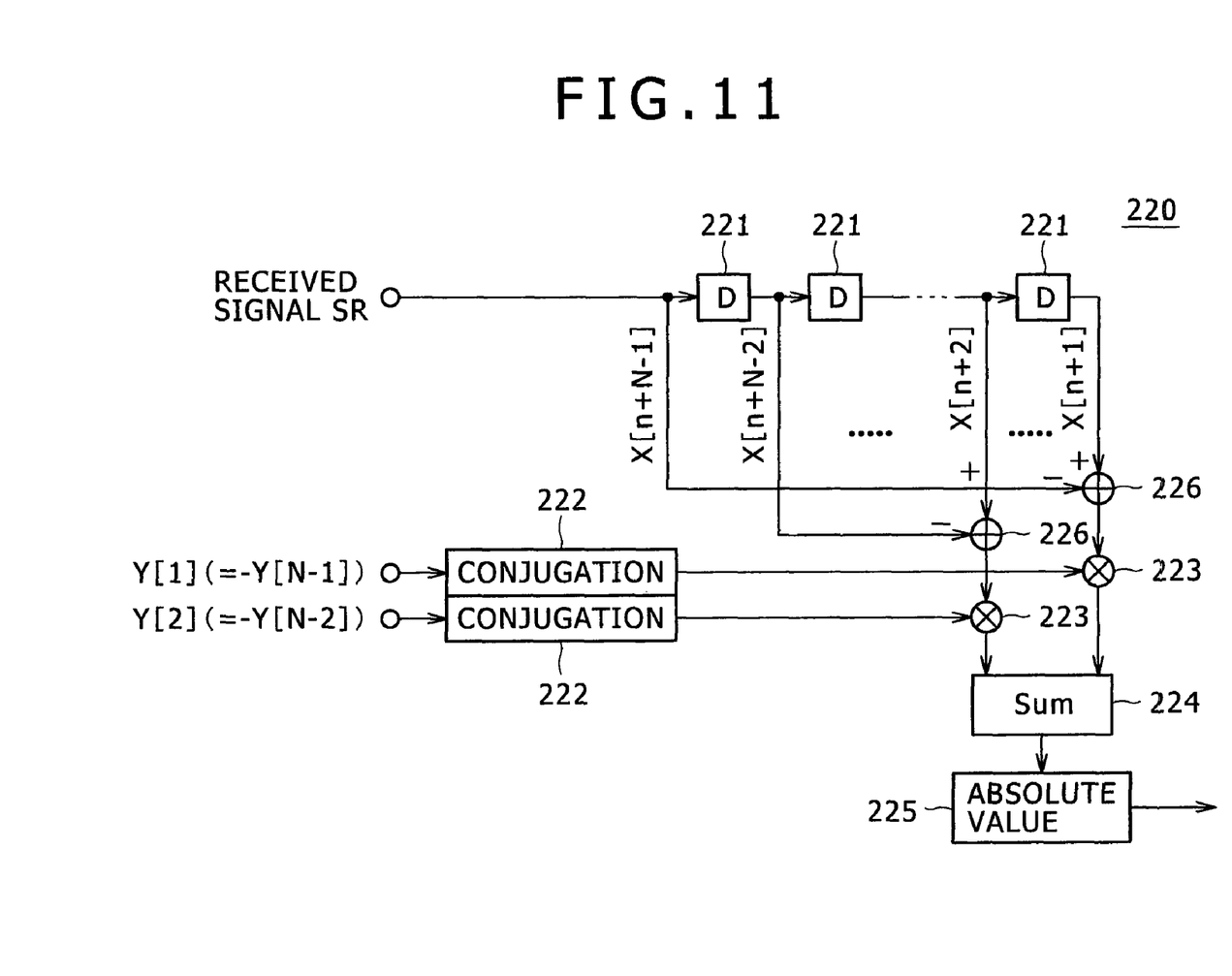
FIG. 11 is a block diagram of a matched filter.

A matched filter using the series Y as its factor can be realized by one multiplier through the integration of multipliers having the same absolute value of the matched filter coefficient. This is explained in more detail with reference to FIG. 11. In FIG. 11, a matched filter 220 is constituted of (N−2) stage serial delay circuits 221, N/2 multiplication circuits 223, each receiving a symbol Y[k] (k=0, . . . , N/2) through a conjugation circuit 222, a summing circuit 224 for summing outputs of the multiplication circuits 223, an absolute value circuit 225 for calculating an absolute value of the output from the summing circuit 224, and an addition circuit 226 for adding/subtracting received signals SR of symmetric relation. An added/subtracted received signal SR is output, per clock, from the addition circuit 226 to each of the multiplication circuits 223 and multiplied by the symbol Y[k]. The absolute value circuit 225 makes a comparison with the multiplication with a threshold (not shown) and outputs a detected pattern match to outside. In FIG. 11, n indicates the number of a frame. Based on the description so far, one may consider n=0.

The matched filter 220 shown in FIG. 11 has only half the number of multiplication circuits in FIG. 1. Therefore, the OFDM receiver 220 mounted with the matched filter 220 has a reduced amount of hardware, compared with a receiver mounted with the matched filter of FIG. 1.

What is claimed is:

1. A matched filter for calculating a correlation between a received signal and a known symbol Y of length N, N being a power of 2, to output an absolute value, where the symbol Y is symmetric in the sense that Y[k]=−Y[N−k], where k=1, . . . , N/2−1, and Y[0]=0, the matched filter comprising:
   (N−2) stage serial delay circuits;
   N/2 conjugation circuits;
   N/2 multiplication circuits, each of them adapted to receive a symbol component Y[k], k=1, . . . N/2, through a respective one of the conjugation circuits;
   a summing circuit for summing outputs of the multiplication circuits;
   an absolute value circuit for calculating an absolute value of the output from the summing circuit; and
   (N/2−1) addition circuits for receiving signals of length N directly and via the N−2 stage delay circuits and for subtracting the (N−1)-th to (N/2+1)-th second half signal components from the 1st to (N/2−1)-th first half signal components, respectively,
   wherein the multiplication circuits are adapted to receive the subtracted signal components from the addition circuits and to multiply them with respective ones of the symbol components Y[k], k=1, . . . , N/2−1, at respective clock timings.

2. The matched filter of claim 1, wherein:
   the symbol Y is obtained from a vector X=(0, C [L/2], C[L/2+1], . . . ,C[L−1], 0, 0, . . . , 0, C[0], C[1], . . . , C[L/2−1]) of length L, the vector X being obtained by padding a zero into the head and L−N−1 zeros into the middle of the vector (C [L/2], C[L/2+1], . . . , C[L−1], C[0], C[1], . . . , C[L/2−1]),
   where C[k]=exp(j*n*M/L*(k+0.5)$^2$), k=0, 1, . . . , L−1, and
   where L is an even number and M is an integer relatively prime with L.

3. A receiver comprising:
   the matched filter of claim 1;
   an S/P conversion circuit for performing S/P conversion on a received signal at timing detected by the matched filter;
   a cyclic prefix removal circuit or removing a cyclic prefix from a parallel signal;
   a high-speed Fourier transform circuit for performing Fourier transformation on an output of the cyclic prefix removal circuit;
   a zero removal circuit for deleting unnecessary zeros from an output of the high-speed Fourier transform circuit; and
   a P/S conversion circuit for performing P/S conversion on an output of the zero removal circuit.

* * * * *